United States Patent [19]

Kovacs

[11] 3,774,117

[45] Nov. 20, 1973

[54] TRANSISTOR-TYPE AMPLIFIER CIRCUIT FOR THE PRODUCTION OF OUTPUT SIGNALS HAVING A PEAK-TO-PEAK AMPLITUDE LARGER THAN THE BREAKDOWN VOLTAGE OF THE TRANSISTORS

[75] Inventor: Albert Kovacs, Budapest, Hungary

[73] Assignee: Medicor Muvek, Budapest, Hungary

[22] Filed: June 1, 1971

[21] Appl. No.: 148,475

[52] U.S. Cl. ........................ 330/14, 330/20, 330/22, 330/30 D, 330/207 P

[51] Int. Cl. ........................ H03f 3/04

[58] Field of Search ............... 330/14, 18, 22, 30 D, 330/40, 69, 207 P, 20

[56] References Cited

UNITED STATES PATENTS

| | | | |
|---|---|---|---|
| 3,275,944 | 9/1966 | Lavin | 330/18 |
| 3,624,417 | 11/1971 | Dao | 330/30 D X |
| 3,261,988 | 7/1966 | Johnson | 330/69 X |

*Primary Examiner*—Roy Lake
*Assistant Examiner*—Lawrence J. Dahl
*Attorney*—Young and Thompson

[57] ABSTRACT

A transistor type amplifier is provided in which the maximum signal applied is greater than the breakdown voltage of the individual transistors in the circuit. An additional transistor is connected in between the load resistor of a first externally controlled transistor and the externally controlled transistor. The base of the additional transistor is connected to a point in a voltage divider, which divider is connected between a point of constant potential and the collector of the additional resistor.

4 Claims, 2 Drawing Figures

PATENTED NOV 20 1973 3,774,117

Figure 1:
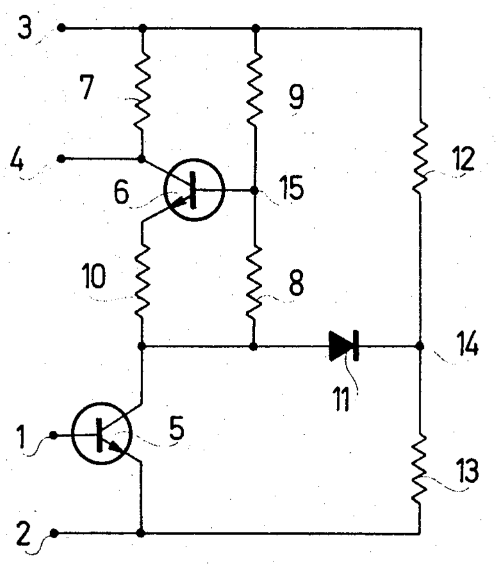

*Inventor*
ALBERT KOVÁCS
By Young + Thompson
*Attorneys*

TRANSISTOR-TYPE AMPLIFIER CIRCUIT FOR THE PRODUCTION OF OUTPUT SIGNALS HAVING A PEAK-TO-PEAK AMPLITUDE LARGER THAN THE BREAKDOWN VOLTAGE OF THE TRANSISTORS

SUMMARY

The upper limit of the amplitude of signals producible by means of transistor-type amplifiers is restricted by the applied supply voltage and on the other hand, the increasing of the supply voltage is limited by the maximum collector-emitter voltage permissible for the transistors figuring in the circuit. For the production of amplified signals with very large amplitude transistors of high breakdown voltage are requested which are, however, rather expensive and difficult to procure.

The invention is based on the recognition that by means of transistors of low breakdown voltage connected in series it is also possible to produce signals with large amplitude if each of the transistors is controlled by means of such a signal which provides for the uniform distribution of the supply voltage among the transistors during operation. For this purpose, further transistors in cascade connection are inserted according to the invention between the transistor controlled by means of an external signal and the loading resistance, and a signal proportional to the collector-emitter voltage of the transistor controlling the same is fed to the base of each transistor.

For the purpose of protecting the transistors, the collector-emitter voltage of all transistors with the exception of one, is restricted — expediently with the help of a holding diode — to a closing voltage smaller than the breakdown voltage.

By connecting as a differential amplifier two amplifiers according to the invention completed by a common emitter resistance, such an amplifier is obtained between the loading resistances of which — in case of push-and-pull control — a signal is produced which is nearly double that which is producible by means of one amplifier.

The invention relates to a transistor-type circuit for the production of output signals having a peak-to-peak amplitude larger than the breakdown voltage of the transistors.

It is known that when the potential difference between the collector and the emitter of the transistor is greater than the breakdown voltage permissible for the given transistor type, then the transistor is ruined. Therefore, the designers have to provide that this circumstance should not occur during the operation of the circuit.

It is also known that in the basic connections of the transistor-type amplifiers (e.g., with the well-known earthed emitter connection) there is a loading resistance connected in series with the transistor, between the terminals of which — in case of control — a potential difference appears which corresponds to the amplified signal. The sum of the voltages dropping at the transistor and at the resistances connected in series with the same, is a constant value equal to the supply voltage, and therefore when the controlled collector current is minimum, then the voltage between the collector and the emitter is equal to the supply voltage.

It follows from the above that in case of large-signal operation, the peak-to-peak amplitude of the applied supply voltage as well as of the amplified signal cannot be more than the breakdown voltage.

In order to produce signals with large amplitude the transistor-type circuits are combined also with thermionic amplifiers. These connections have the drawback that the application of such — so-called hybrid coil circuits is difficult and their size impedes miniaturisation.

The dynamic range can be widened also by the application of push-pull amplifiers, and in this case there appear between the output points of the multiplier section controlled in anti-phase — balanced with respect to the supply voltage — nearly twice the signal voltage which can be produced by means of one multiplier section.

The invention aims at the elimination of the afroesaid difficulties and at the widening of the dynamic range of the amplifier, in particular at the establishing of such a transistor-type amplifier circuit at the output of which the amplitude of the obtainable signal is larger than the breakdown voltage permissible for one single transistor.

The invention consists in that between the loading resistance and the transistor with external control there is inserted — preferably through a resistance — at least one additional transistor with cascade connection, and the base of this additional transistor is connected to the divider point of a voltage-divider chain which is inserted between a point of constant potential and the collector of this further transistor.

According to the invention it is expedient to protect the transistors against breakdowns in such a way that with the exception of the transistor connected to the loading resistance, each collector of every transistor is joined through a holding diode to a point of constant potential.

It is also expedient to lead out through a common loading resistance the emitter of the transistors with external control of two amplifiers identically constructed. In this way such a differential amplifier is obtained between the emitter resistances of which — in case of anti-phase control — nearly twice the output signal producable by means of the amplifier according to the invention can be obtained.

The invention will be described hereunder in detail with reference to the drawings showing the circuit diagram of the embodiments given by way of example of the amplifier scheme according to the invention. In the drawings, the identical details have been marked with identical reference numbers or with reference numbers increased by 20.

Figure 2:
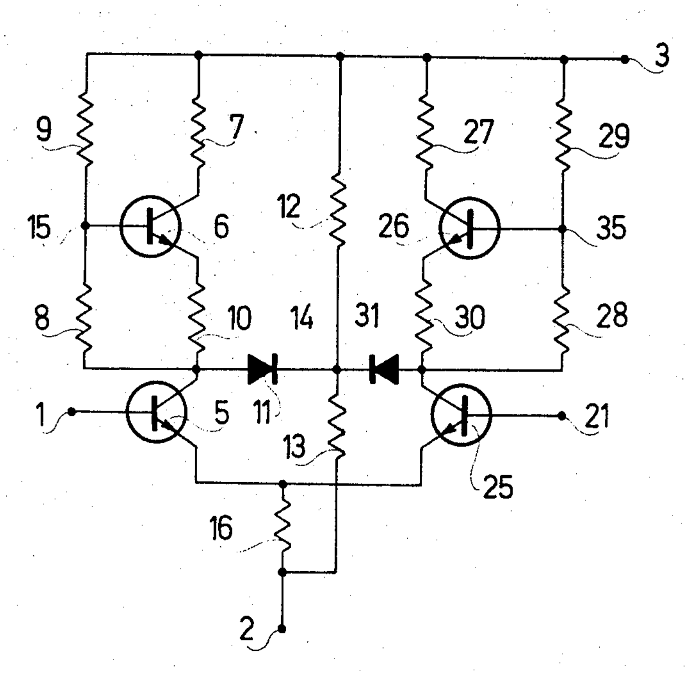

FIG. 1 of the drawings illustrates a first embodiment of the invention; and:

FIG. 2 of the drawings illustrates a second embodiment of the invention in a differential amplifier form.

FIG. 1 shows the simplest embodiment of the amplifier circuit according to the invention containing an externally controlled transistor 5 and another transistor 6 in cascade. By cascade, an arrangement of transistors is meant wherein to the collector of the first transistor the emitter of a further transistor, and to the collector of the first transistor the emitter of a further transistor, and to the collector of this latter the emitter of another transistor is joined, and so on. The collector of the transistor 5 is connected through a resistance 10 to the emitter of transistor 6. In the collector circuit of transistor 6 there is a loading resistance 7 and its point which is common with the collector constitutes the terminal of the amplifier scheme. Between the collector of transistor 5 and a point of constant potential, expediently the pole 3 of the supply voltage, there is a voltage divider chain consisting of resistors 8 and 9, the divider point 15 of which is connected to the base of transistor 6. With the embodiment shown by way of example, the divider point 14 of another divider chain consisting of resistors 12 and 13 is also connected to the collector of transistor 5 through a diode 11 (so called holding diode) prestressed in closing direction. It is possible to build up the voltage divider chain not only of ohmic resistances, but e.g., of any combination of ohmic resistances, capacitors and semiconductors.

If an external pilot signal is forwarded to transistor 5 between the points 1 and 2, then its collector current will change according to the instantaneous characteristics of the signal. The collector current flows partly through the divider chain 8, 9 and partly through resistor 10 and transistor 6 the collector current of which is determined by the parameters of this transistor and by the relation of resistors 8 and 9. With decreasing collector current the collector-emitter voltage of transistor 6 increases, whereas the potential difference between pole 3 of the supply voltage and the collector of transistor 5 decreases. The voltage proportional to this potential difference and measurable at divider point 15 controls the transistor 6 in closing direction so that the collector-emitter voltage of transistor 6 will increase, too. Thus the transistor 6 follows the current and voltage chracteristics of the controlled transistor 5, and the supply voltage will always be distributed proportionally between the two transistors. If the potential of the collector of transistor 5 exceeds the potential of divider point 14 of divider chain 12, 13 — which potential is expediently smaller than the breakdown voltage of the transistor — then diode 11 begins to conduct and limits thus the collector-emitter voltage of transistor 5 to the potential of divider point 14.

With the object of further increasing the peak-to-peak amplitude of the output signal, two amplifiers according to the invention are connected as a known differential amplifier, as shown in FIG. 2. For that purpose the emitter of the transistors 5 and 25 are connected to pole 2 of the supply voltage through a common emitter resistor 16. As it is known from the theory of the differential amplifiers, the resistor 16 can be replaced also by a current generator having an interior resistance of any high value. In the case of a push-pull controlled amplifier, the transistors 5 and 25 are controlled through their bases between points 1 and 21. If the breakdown voltage of transistors 5 and 25 is identical, then the point 14 of constant potential may be common for both holding diodes 11 and 31.

It appears from the above that the amplifier circuit according to the invention can be realized by means of transistors having a breakdown voltage smaller than the applied supply voltage, and by means of the embodiment described at first by way of example it is possible to obtain nearly double, or by means of the push-and-pull variant nearly quadruple the signal amplitude which can be realized by means of the basic circuit with one transistor.

For the sake of simplicity, in the above described embodiment the number of the further transistors connected in cascade was one.

However, it is apparent to those skilled in the art that the relation as mentioned can be further increased by connecting — expediently through resistors — more than two transistors in cascade, because in such cases the supply voltage can be uniformly distributed among a number of transistors. Evidently, it is expedient in such cases, too, to protect the transistors by means of holding diodes against breakdown.

What we claim is:

1. A transistorized amplifier circuit for supplying output signals having peak-to-peak amplitudes greater than the breakdown voltage of the individual transistors in the circuit, comprising a load resistor (7) and an externally controlled transistor (5), a further transistor (6) in cascade connection between said load resistor and said externally controlled transistor through an emitter resistor (10) of said further transistor (6), a voltage divider chain (8,9) between a point (3) of constant potential and the collector of said externally controlled transistor, the base of said further transistor (6) being connected to the point of division (15) of said voltage divider chain, and the collector of said externally controlled transistor (5) being connected through said emitter resistor (10) to the emitter of said further transistor (6).

2. A transistorized amplifier circuit as claimed in claim 1, in which the collector of said externally controlled transistor (5) is coupled through a holding diode (11) to a point (14) of constant potential.

3. A transistorized amplifier circuit as claimed in claim 1, in which the collectors of the transistors other than said further transistor (6) are connected through holding diodes to a point of constant potential.

4. A transistorized amplifier circuit as claimed in claim 1, in which the emitters of externally controlled transistors (5, 25) of two amplifiers of identical structure are led out through a common emitter resistance (16).

* * * * *